(12) United States Patent
Wong et al.

(10) Patent No.: US 8,546,781 B2
(45) Date of Patent: Oct. 1, 2013

(54) NITROGEN DOPED ALUMINUM OXIDE RESISTIVE RANDOM ACCESS MEMORY

(75) Inventors: Siu-Weng S. Wong, Woodside, CA (US); Wanki Kim, White Plains, NY (US); Zhiping Zhang, Stanford, CA (US); Sung Il Park, Stanford, CA (US)

(73) Assignee: The Board of Trustees of the Leland Stanford Junior University, Palo Alto, CA (US)

( * ) Notice: Subject to any disclaimer, the term of this patent is extended or adjusted under 35 U.S.C. 154(b) by 0 days.

(21) Appl. No.: 13/469,556

(22) Filed: May 11, 2012

(65) Prior Publication Data

US 2012/0305881 A1 Dec. 6, 2012

Related U.S. Application Data

(60) Provisional application No. 61/519,845, filed on May 31, 2011.

(51) Int. Cl.
*H01L 45/00* (2006.01)

(52) U.S. Cl.
USPC ............ 257/2; 365/148; 257/E45.001; 257/3; 257/4; 257/5

(58) Field of Classification Search
USPC .......................................... 257/2–5; 365/148
See application file for complete search history.

(56) References Cited

U.S. PATENT DOCUMENTS

| | | | |
|---|---|---|---|
| 7,696,503 B2* | 4/2010 | Lung et al. | 257/2 |
| 8,279,656 B2* | 10/2012 | Chien et al. | 365/148 |
| 2009/0095953 A1* | 4/2009 | Chen et al. | 257/4 |
| 2011/0194329 A1* | 8/2011 | Ohba et al. | 365/148 |
| 2011/0317471 A1 | 12/2011 | Chien et al. | |

* cited by examiner

*Primary Examiner* — Matthew W Such
*Assistant Examiner* — Frederick B Hargrove
(74) *Attorney, Agent, or Firm* — Lumen Patent Firm

(57) ABSTRACT

A resistive random access memory (RRAM) device is provided that includes a first electrode, a second electrode, and a resistance-change film disposed between the first electrode and the second electrode, where the resistance-change film includes an atomic ratio of aluminum, oxygen and nitrogen.

26 Claims, 9 Drawing Sheets

NITROGEN DOPED ALUMINUM OXIDE RESISTIVE RANDOM ACCESS MEMORY

CROSS-REFERENCE TO RELATED APPLICATIONS

This application claims priority from U.S. Provisional Patent Application 61/519,845 filed May 31, 2011, which is incorporated herein by reference.

STATEMENT OF GOVERNMENT SPONSORED SUPPORT

This invention was made with Government support under contract N66001-04-1-8916 awarded by Department of the Navy (ONR). The Government has certain rights in this invention.

FIELD OF THE INVENTION

The present invention relates generally to Resistive Random-Access-Memory (RRAM). More particularly, the invention relates to a device and method for creating a RRAM that does not require a forming operation.

BACKGROUND OF THE INVENTION

Resistive Random-Access-Memory (RRAM) is a prime candidate for ultra-high density non-volatile memory. High-speed operation, superior scalability and feasibility of 3D integration have been demonstrated. However, most reported RRAM cells require a high voltage forming process and high programming currents, which complicate the design. Some cell structures involve materials that may not be compatible with manufacturing, e.g., Pt electrode. What is needed is a simple RRAM cell that is based on Al, a common material that is compatible with semiconductor manufacturing.

SUMMARY OF THE INVENTION

To address the needs in the art, a resistive random access memory (RRAM) device is provided that includes a first electrode, a second electrode, and a resistance-change film disposed between the first electrode and the second electrode, where the resistance-change film includes an atomic ratio of aluminum, oxygen and nitrogen.

According to one aspect of the invention, the RRAM device includes forming free switching.

In another aspect of the invention, the RRAM device has uinpolar switching.

In a further aspect of the invention, the RRAM device includes bipolar switching.

In one aspect of the invention, the electrodes and resistance-change film are deposited without exposing to air.

According to another aspect of the invention, the electrode includes aluminum (Al).

In yet another aspect of the invention, the electrode includes titanium nitride (TiN).

According to a further aspect of the invention, the electrode includes tantalum nitride (TaN).

In another aspect of the invention, the electrode includes titanium (Ti).

In a further aspect of the invention, the electrode can include tantalum (Ta).

According to another aspect of the invention, the electrode can include tungsten (W).

In a further aspect of the invention, the electrode can include copper (Cu).

DETAILED DESCRIPTION

Nitrogen-doped AlO$_x$ Resistive RAM has been integrated on CMOS. The memory cell requires no forming, and sub-µA programming currents. The cell is capable of multi-bit storage, reliable for over $10^5$ switching cycles and 10 years retention at 125° C.

Figure 1:
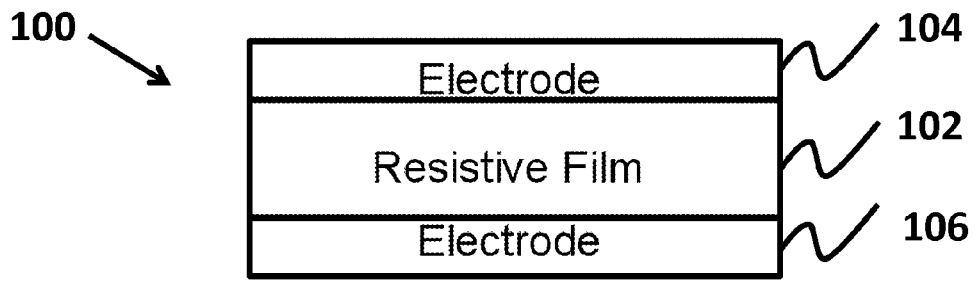
FIG. 1 shows a schematic showing the structure of a resistive random access memory (RRAM) cell, according to one embodiment of the invention.
Figure 2:
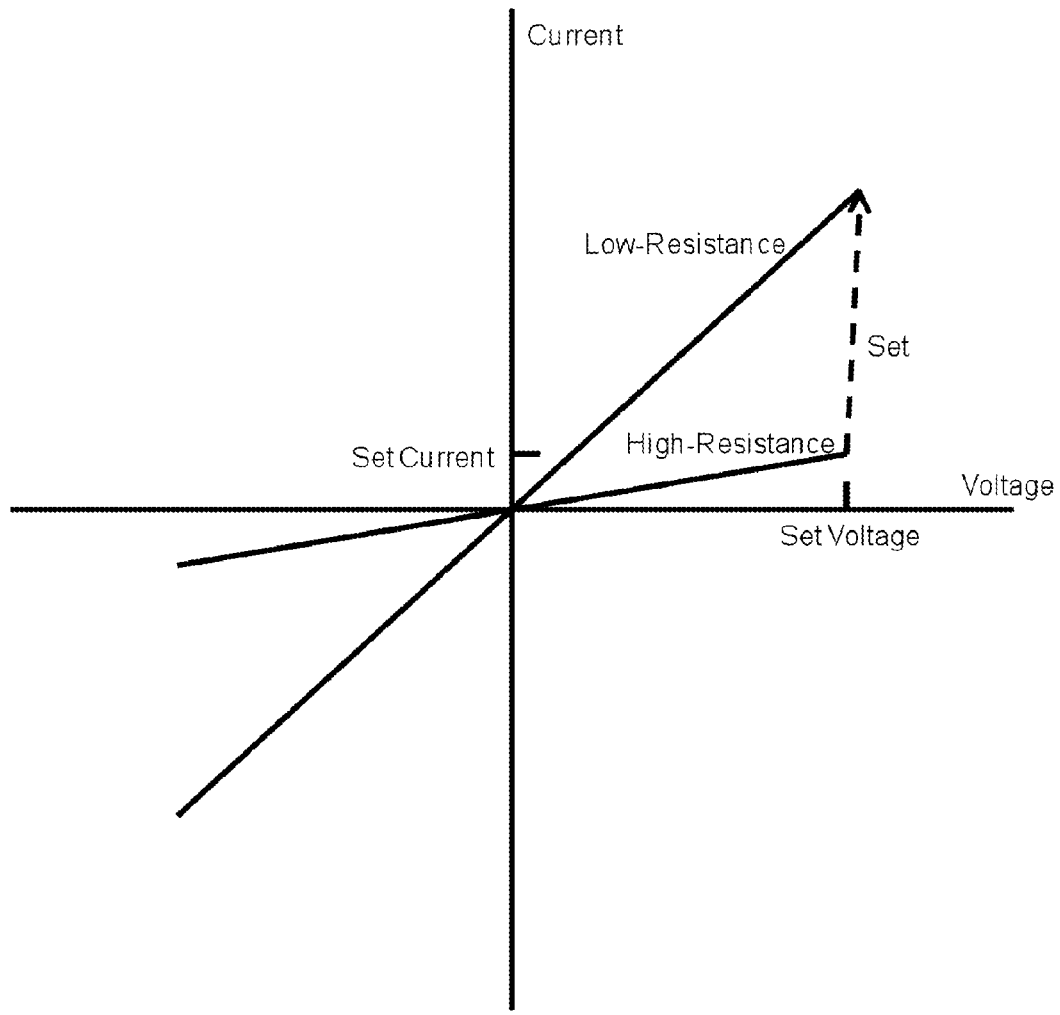
FIG. 2 shows the voltage-current characteristic of a RRAM cell illustrating the "set" or "turn-on" operation, the switching is from a high-resistance state to a low-resistance state.
Figure 3:
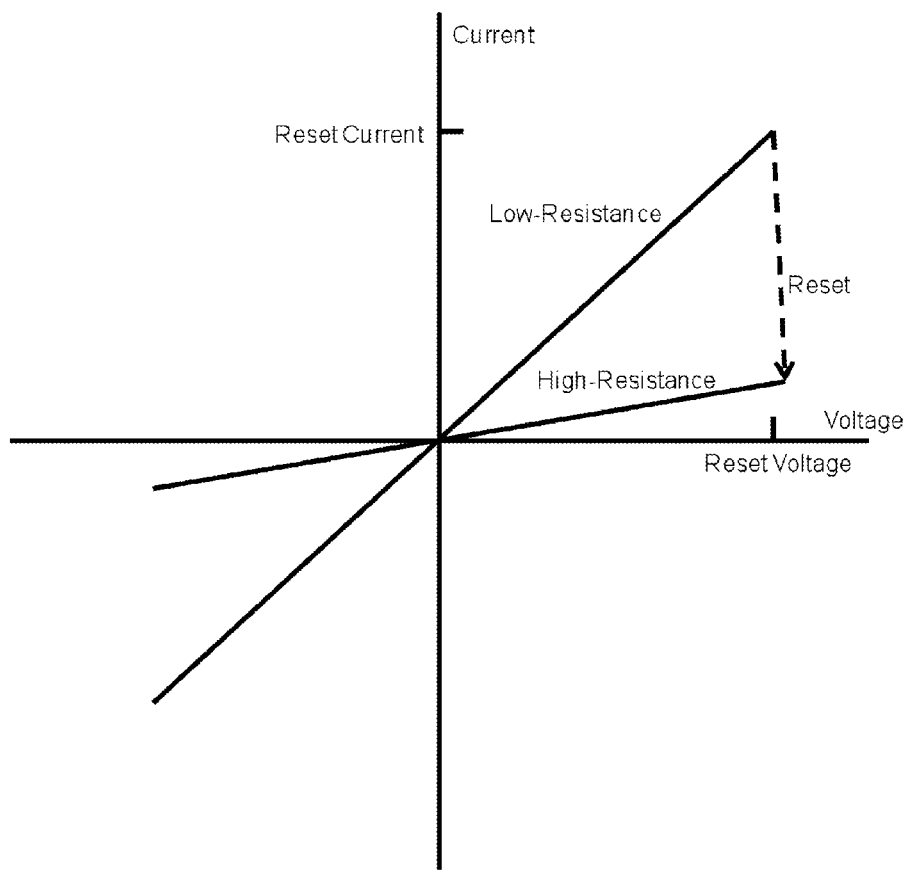
FIG. 3 shows the voltage-current characteristic of a RRAM cell illustrating the "reset" or "turn-off" operation, the "unipolar" switching is from a low-resistance state to a high-resistance state.
Figure 4:
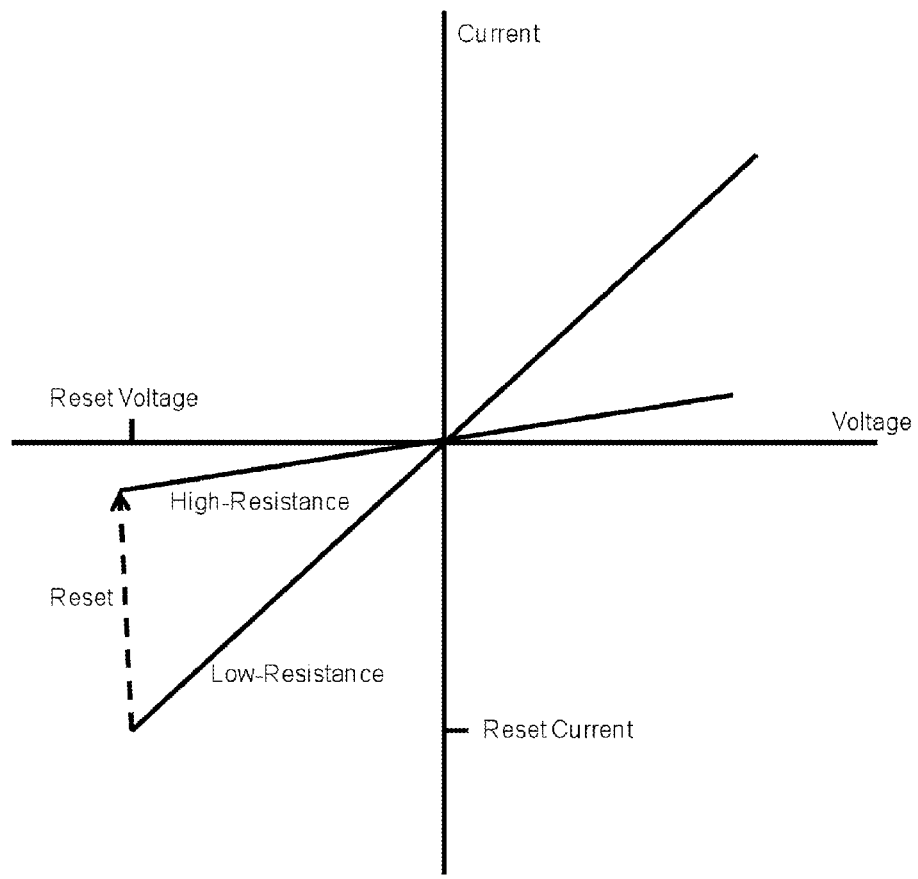
FIG. 4 shows the voltage-current characteristic of a RRAM cell illustrating the "reset" or "turn-off" operation, the "bipolar" switching is from a low-resistance state to a high-resistance state.

Resistive Random-Access-Memory (RRAM) is a prime candidate for ultra-high density non-volatile memory. The memory cell 100, as illustrated in FIG. 1, includes a resistive film 102 sandwiched between a first electrode 104 and a second electrode 106. The resistance of the resistive film 102 can be changed with the application of sufficient voltage and current. As shown in FIG. 2, the resistive film will change from a high-resistance state to a low-resistance state when a voltage and current exceeding the "set voltage" and "set current", respectively, are applied across the film. This is known as the "set" or "turn on" operation. The resistive film will change from a low-resistance state to a high-resistance state when a voltage and current exceeding the "reset voltage" and "reset current", respectively, are applied across the film. This is known as the "reset" or "turn off" operation. The reset voltage and current can be of the same polarity as the set voltage and current as shown in FIG. 3, which is known as "unipolar switching", or of opposite polarity as shown in FIG. 4, which is known as "bipolar switching".

Figure 5:
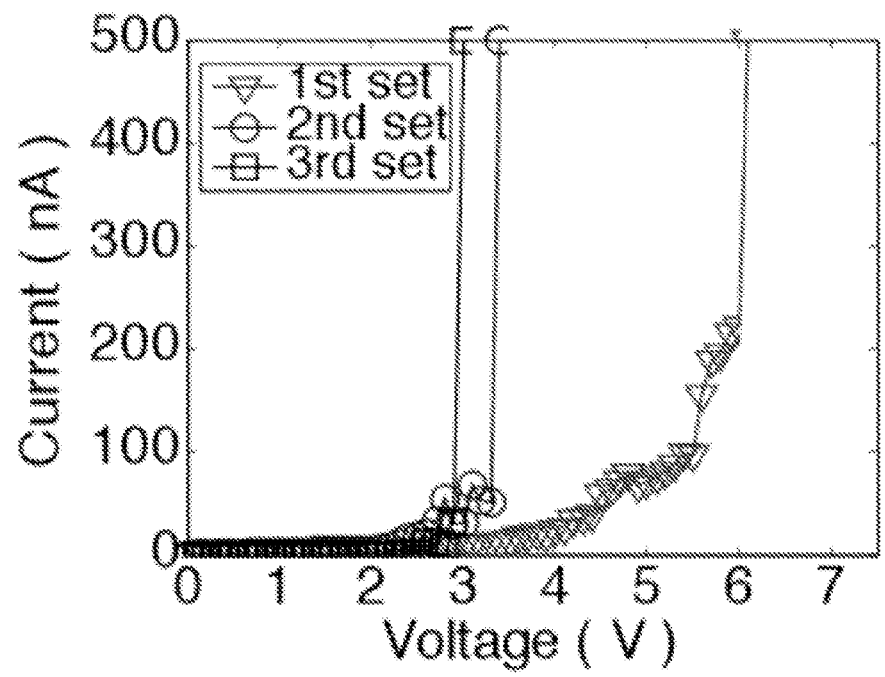
FIG. 5 shows the set operations of a RRAM cell with aluminum oxide resistive film, illustrating "forming", the higher voltage and current required in the first set cycle.
Figure 6:
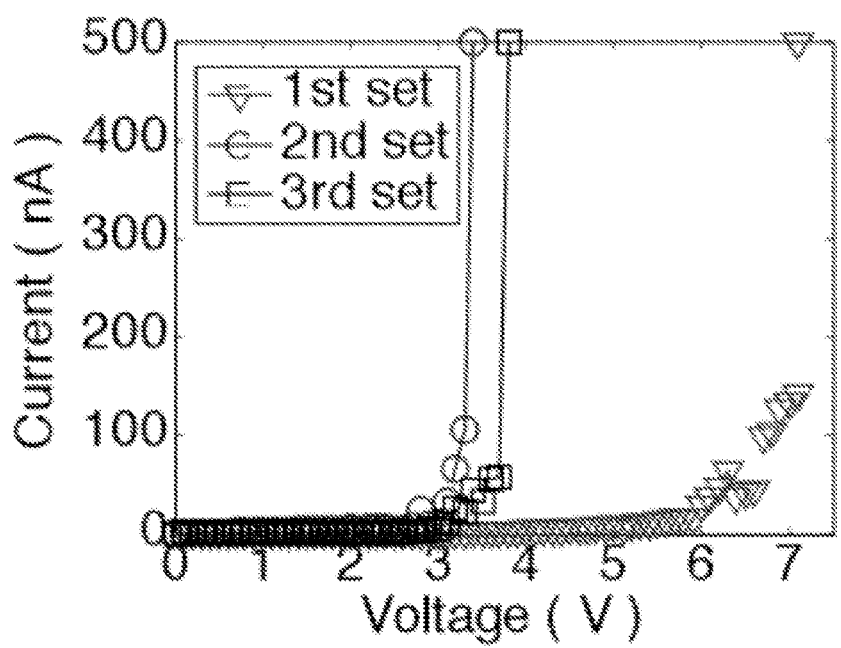
FIG. 6 shows the set operations of a RRAM cell with aluminum nitride resistive film, illustrating "forming", the higher voltage and current required in the first set cycle.

Most reported RRAM cells require a higher set voltage and set current in the first "set" cycle, which is known as "forming". As illustrated in FIG. 5 and FIG. 6, resistive films of aluminum oxide and aluminum nitride require the forming process. Forming complicates the design as the transistors and circuits interfacing with the RRAM cells must be able to handle the high forming voltage and current. There is also concern that the high forming voltage and current may degrade the reliability and endurance of the resistive film during subsequent switching cycles.

Figure 7:
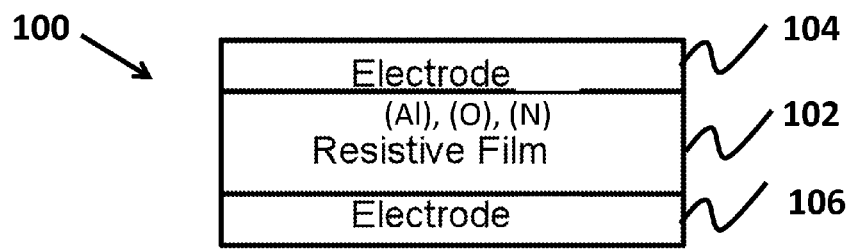
FIG. 7 shows the present invention, RRAM cell with a resistive film having aluminum, oxygen and nitrogen, sandwiched between the electrodes, according to one embodiment of the invention.
Figure 8:
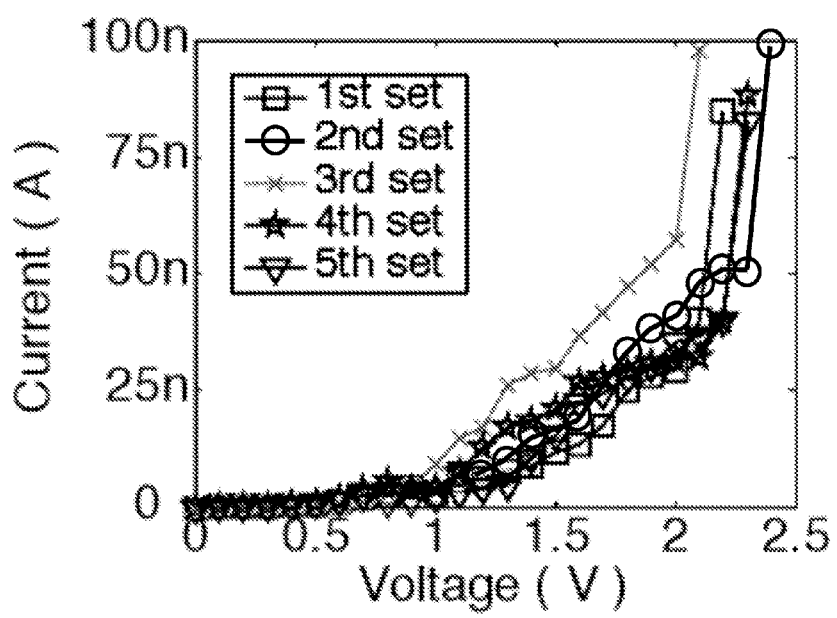
FIG. 8 shows the set operations of present invention RRAM cell, illustrating similar set voltages and currents for the first and subsequent cycles, where no "forming" is required, according to one embodiment of the invention.

The present invention relates to a device and method for creating a resistive random access memory (RRAM) that does not require the forming process. As illustrated in FIG. 7, the resistive film 102 includes aluminum (Al), oxygen (O) and nitrogen (N), and is sandwiched between two electrodes 104 and 106. The atomic ratio of Al, O and N in the resistive film 102 can be adjusted to optimize the memory characteristics. The resistive film 102 can be deposited by physical sputtering, atomic layer deposition, chemical vapor deposition, or other techniques common in the semiconductor industry. The two electrodes 104 and 106 can be of different materials including aluminum (Al), titanium nitride (TiN), tantalum nitride (TaN), titanium (Ti), tantalum (Ta), tungsten (W), copper (cu) or other conductors commonly used in the semiconductor industry. Ideally, the stack of electrode 104, resistive film 102 and electrode 106 are deposited without exposing the wafer to air. Other techniques that minimize or remove the contamination at the interfaces between the electrodes and the resistive film can also be adopted. As shown in FIG. 8, no forming is required for this RRAM, with similar set voltage and set current for the first and subsequent set cycles.

Figure 9:
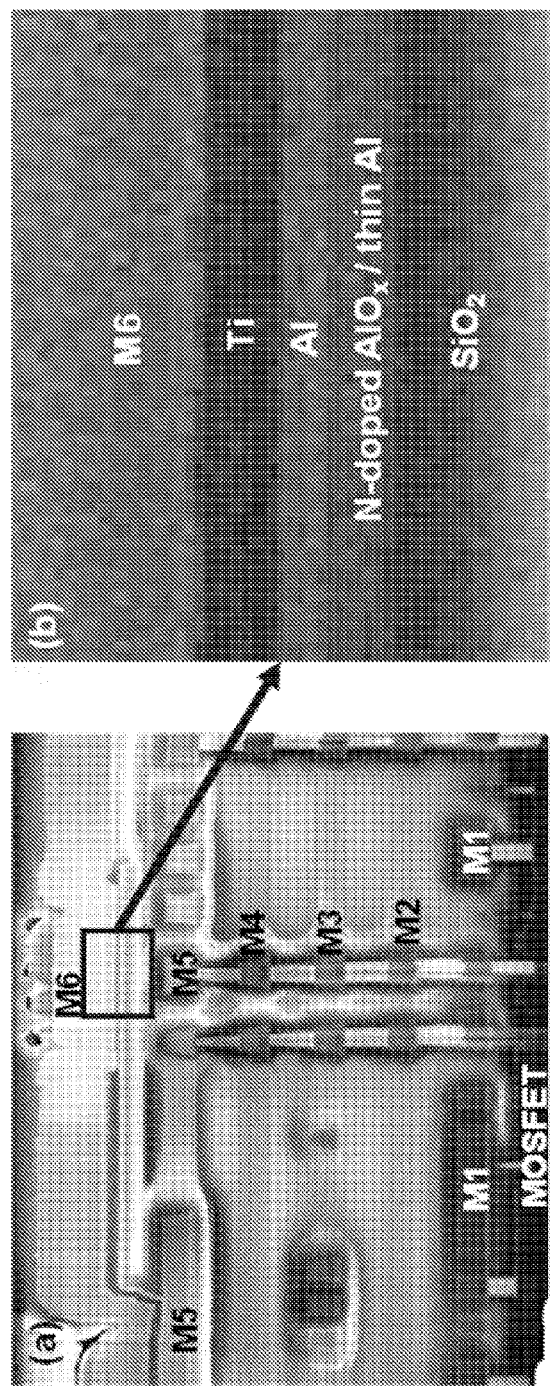
FIG. 9(a) shows a cross-sectional view of one embodiment of a RRAM stack on top of standard 180 nm CMOS with 5 layers of metals, according to the current invention.
FIG. 9(b) shows an expanded view of the 1 µm×1 µm RRAM cell, according to the current invention.

FIG. 9(a) shows a cross-sectional view of one embodiment of a RRAM stack on top of standard 180 nm CMOS with 5 layers of metals, according to the current invention. A $6^{th}$ layer of metal is used to connect the RRAM with the CMOS. FIG. 9(b) shows an expanded view of the 1 μm×1 μm RRAM cell, which is composed of a nitrogen-doped $AlO_x$ (N—$AlO_x$) resistance-change film sandwiched between Al top and bottom electrodes. The N—$AlO_x$ film is sputtered in an ambient of $O_2$ and $N_2$. The nitrogen content in the film can be controlled by adjusting the gas flow rates. The Al electrodes are deposited in-situ to prevent interfacial contamination.

Figure 10:
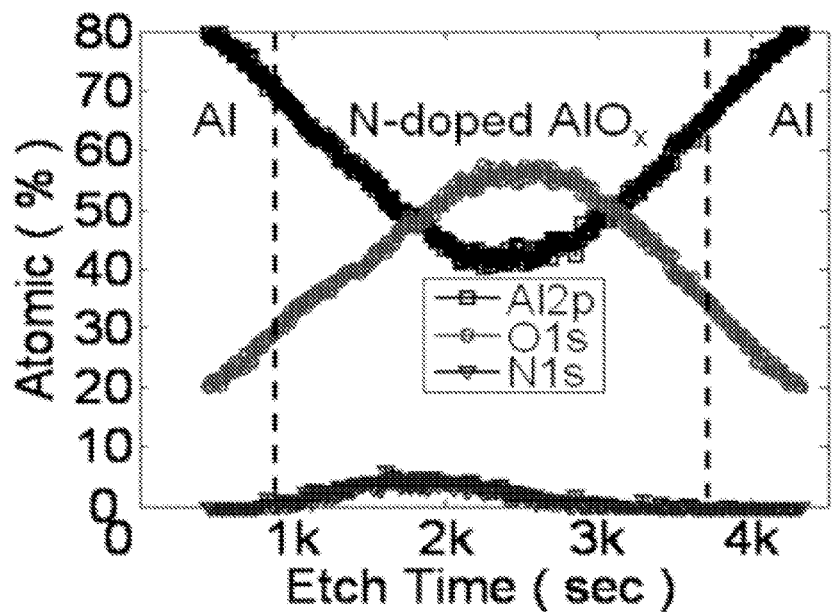
FIG. 10 shows the XPS atomic profile of the RRAM stack, according to the current invention.

FIG. 10 is the XPS atomic profile of the RRAM stack. This composition yields excellent RRAM characteristics.

Figure 11:
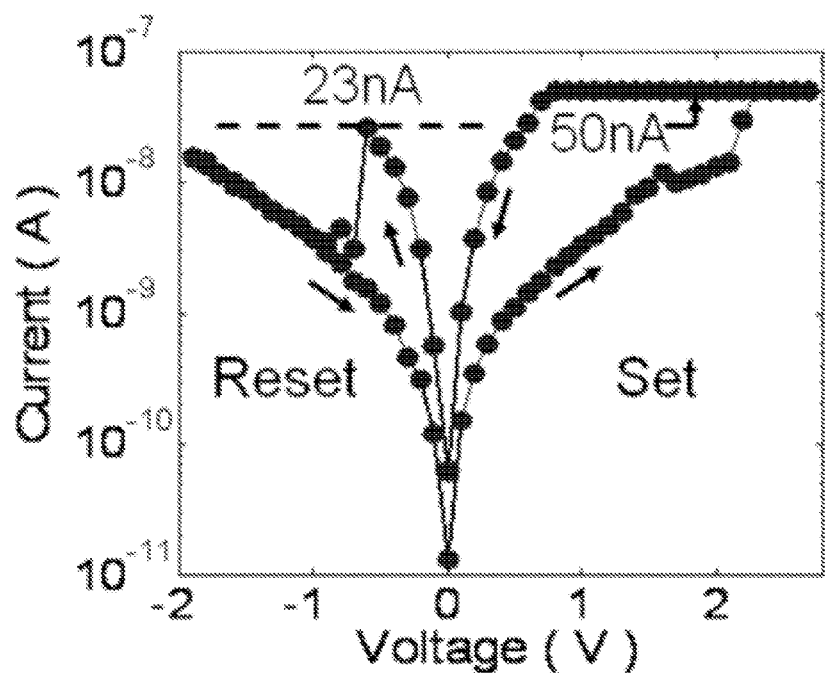
FIG. 11 shows bipolar switching behavior of the N—AlO$_x$ cell, according to the current invention.
Figure 12:
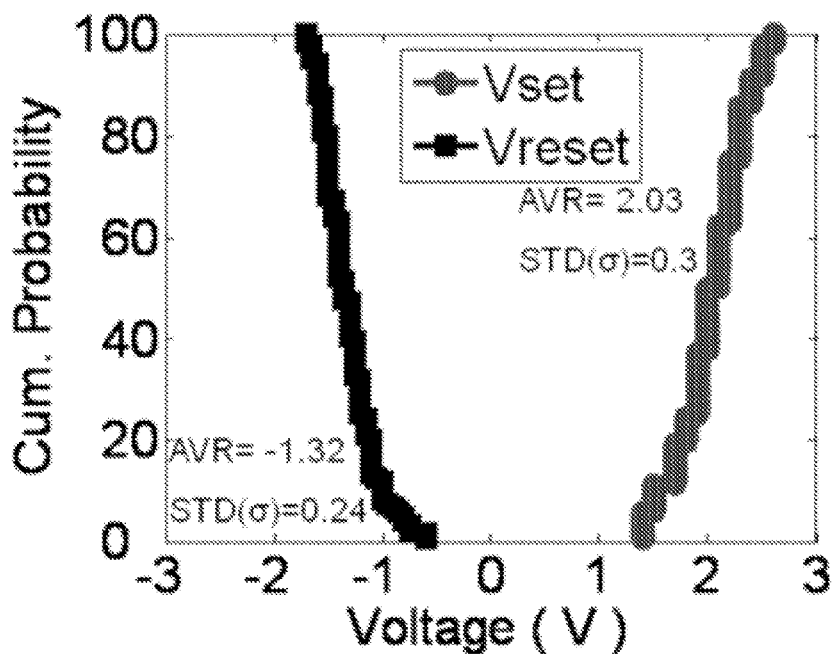
FIG. 12 shows a tight distribution of the set and reset voltages of the N—AlO$_x$ cell in FIG. 11, according to the current invention.

Typical bipolar switching behavior of the N—$AlO_x$ cell is shown in FIG. 11, with a tight distribution of the set and reset voltages illustrated in FIG. 12.

With a higher applied current, the cell is set to a lower on-resistance. To achieve an on/off ratio of 100 (HRS of 1 GΩ and LRS of 10 MΩ), the set current is about 0.5 μA, and the reset current is about 1 μA.

Figure 13:
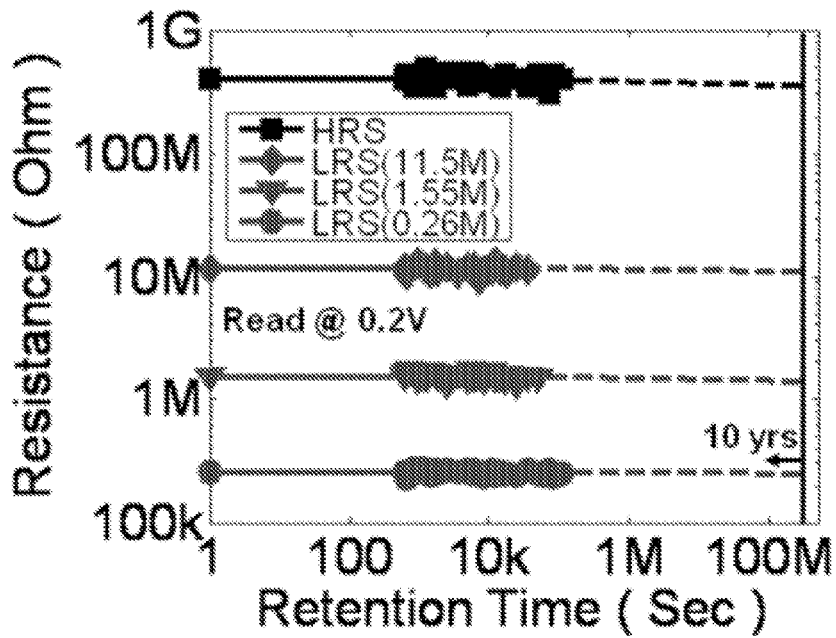
FIG. 13 shows the stability of various programmed states, according to the current invention.
Figure 14:
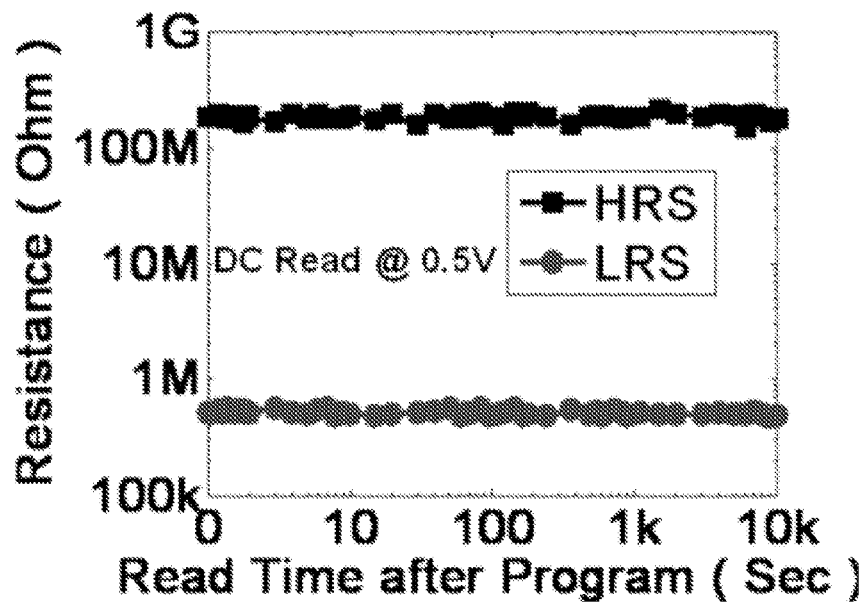
FIG. 14 shows there is no detectable disturbance on the cell status for at least $10^4$ seconds, which corresponds to over $10^{11}$ cycles assuming a read cycle of 100 ns, according to the current invention.
Figure 15:
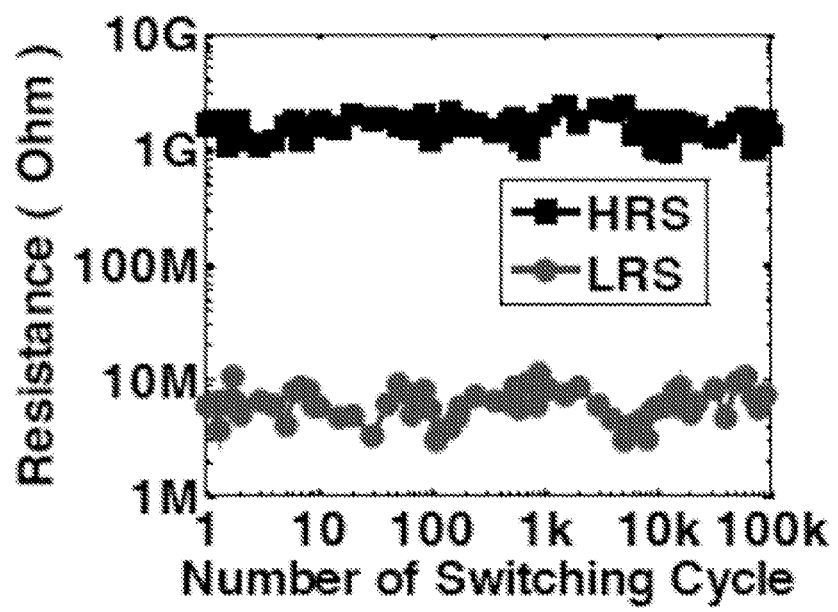
FIG. 15 shows the endurance of the cell, according to the current invention.

FIG. 13 shows the stability of various programmed states. Retention of multi-bit storage for over 10 years at 125° C. is projected. Read disturb is evaluated by monitoring the cell resistance under a constant read voltage of 0.5V. As illustrated in FIG. 14, there is no detectable disturbance on the cell status for at least $10^4$ seconds, which corresponds to over $10^{11}$ cycles assuming a read cycle of 100 ns. The endurance of the cell is shown in FIG. 15. There is no noticeable degradation of the on-off window up to $10^5$ cycles.

The integration of forming-free nitrogen-doped $AlO_x$ RRAM on CMOS has been demonstrated. The RRAM cell requires low programming currents, and exhibits excellent reliability characteristics suitable for multi-bit storage.

The present invention has now been described in accordance with several exemplary embodiments, which are intended to be illustrative in all aspects, rather than restrictive. Thus, the present invention is capable of many variations in detailed implementation, which may be derived from the description contained herein by a person of ordinary skill in the art. For example, the resistance-change film and electrodes can be deposited by other techniques such as atomic layer deposition, chemical vapor deposition, plasma enhanced deposition or other techniques common in semiconductor manufacturing. The electrode can be of conductor common in semiconductor manufacturing. The electrodes can be of different materials. The size of the RRAM device can be reduced with advanced patterning and etching techniques in semiconductor manufacturing. The size of the resistance-change film, the first electrode and the second electrode can be different.

All such variations are considered to be within the scope and spirit of the present invention as defined by the following claims and their legal equivalents.

What is claimed:

1. A resistive random access memory (RRAM) device, comprising:
   a. a first electrode;
   b. a second electrode; and
   c. a resistance-change film disposed between said first electrode and said second electrode, wherein said resistance-change film is a compound consisting of aluminum, oxygen and contamination common in semiconductor manufacturing.

2. The RRAM device of claim 1, wherein said RRAM device comprises forming free switching.

3. The RRAM device of claim 1, wherein said RRAM device comprises uinpolar switching.

4. The RRAM device of claim 1, wherein said RRAM device comprises bipolar switching.

5. The RRAM device of claim 1, wherein said electrodes and resistance-change film are deposited without exposing to air.

6. The RRAM device of claim 1, wherein said first electrode or said second electrode comprises aluminum (Al).

7. The RRAM device of claim 1, wherein said first electrode or said second electrode comprises titanium nitride (TiN).

8. The RRAM device of claim 1, wherein said first electrode or said second electrode comprises tantalum nitride (TaN).

9. The RRAM device of claim 1, wherein said first electrode or said second electrode comprises titanium (Ti).

10. The RRAM device of claim 1, wherein said first electrode or said second electrode comprises tantalum (Ta).

11. The RRAM device of claim 1, wherein said first electrode or said second electrode comprises tungsten (W).

12. The RRAM device of claim 1, wherein said first electrode or said second electrode comprises copper (Cu).

13. The RRAM device of claim 1, wherein said resistance-change film is disposed for sub-μA programming currents.

14. A resistive random access memory (RRAM) device, comprising:
   a. a first electrode;
   b. a second electrode; and
   c. a resistance-change film disposed between said first electrode and said second electrode, wherein said resistance-change film is a compound consisting essentially of aluminum, oxygen, and nitrogen.

15. The RRAM device of claim 14, wherein said RRAM device comprises forming free switching.

16. The RRAM device of claim 14, wherein said RRAM device comprises uinpolar switching.

17. The RRAM device of claim 14, wherein said RRAM device comprises bipolar switching.

18. The RRAM device of claim 14, wherein said electrodes and resistance-change film are deposited without exposing to air.

19. The RRAM device of claim 14, wherein said first electrode or said second electrode comprises aluminum (Al).

20. The RRAM device of claim 14, wherein said first electrode or said second electrode comprises titanium nitride (TiN).

21. The RRAM device of claim 14, wherein said first electrode or said second electrode comprises tantalum nitride (TaN).

22. The RRAM device of claim 14, wherein said first electrode or said second electrode comprises titanium (Ti).

23. The RRAM device of claim 14, wherein said first electrode or said second electrode comprises tantalum (Ta).

24. The RRAM device of claim 14, wherein said first electrode or said second electrode comprises tungsten (W).

25. The RRAM device of claim 14, wherein said first electrode or said second electrode comprises copper (Cu).

26. The RRAM device of claim 14, wherein said resistance-change film is disposed for sub-$\mu$A programming currents.

* * * * *

UNITED STATES PATENT AND TRADEMARK OFFICE
CERTIFICATE OF CORRECTION

PATENT NO.         : 8,546,781 B2                      Page 1 of 1
APPLICATION NO.    : 13/469556
DATED              : October 1, 2013
INVENTOR(S)        : Siu-Weng S. Wong et al.

It is certified that error appears in the above-identified patent and that said Letters Patent is hereby corrected as shown below:

In the Claims

In Col. 4, line 39 insert --, nitrogen-- after "oxygen"

Signed and Sealed this
Twenty-sixth Day of November, 2013

Margaret A. Focarino
*Commissioner for Patents of the United States Patent and Trademark Office*